United States Patent [19]
Donohue

[11] Patent Number: 6,147,019
[45] Date of Patent: Nov. 14, 2000

[54] BORATE GLASS BASED CERAMIC TAPE

[75] Inventor: Paul C. Donohue, Wilmington, Del.

[73] Assignee: E. I. du Pont de Nemours and Company, Wilmington, Del.

[21] Appl. No.: 09/425,663

[22] Filed: Oct. 22, 1999

Related U.S. Application Data

[63] Continuation of application No. 09/012,296, Jan. 23, 1998, abandoned.

[51] Int. Cl.$^7$ ........................................ C03C 3/15
[52] U.S. Cl. .................................. 501/50; 501/52
[58] Field of Search ........................ 501/50, 52

[56] References Cited

U.S. PATENT DOCUMENTS

| | | | |
|---|---|---|---|
| 3,510,325 | 5/1970 | Broemer et al. | 106/54 |
| 4,593,006 | 6/1986 | Takabatake et al. | 501/32 |
| 4,751,148 | 6/1988 | Popma et al. | 428/690 |
| 5,043,302 | 8/1991 | Mattox | 501/17 |
| 5,164,342 | 11/1992 | Muralidhar et al. | 501/20 |
| 5,378,662 | 1/1995 | Tsuyuki | 501/50 |
| 5,665,660 | 9/1997 | Yamawaki et al. | 501/32 |
| 5,674,789 | 10/1997 | Anquetil | 501/50 |
| 5,922,444 | 7/1999 | Tsuyuki et al. | 501/50 |

FOREIGN PATENT DOCUMENTS

| | | |
|---|---|---|
| 0004023 | 1/1978 | Japan . |
| 61-242925 | 10/1986 | Japan . |
| 8-190896 | 7/1996 | Japan . |
| 7-187705 | 7/1998 | Japan . |
| 11-079781 | 3/1999 | Japan . |
| 0617400 | 7/1978 | U.S.S.R. . |

OTHER PUBLICATIONS

Database WPI, Section Ch, Week 9417, Derwent Publications Ltd., London, GB; AN–142603 XP002106389 & SU 1 794 905 A (Lengd Avangard Sci Prodn Assoc), Feb. 15, 1993.

Electrical Properties Of Alkali–Free Borate Glasses, E. Gough et al., Physics and Chemistry, vol. 10, No. 3, 1969.

Abstract For Paper: 98 MCM International Conference and Exhibition On Multichip Modules and Density Packaging, Apr. 4, 1998.

*Primary Examiner*—Paul Marcantoni

[57] ABSTRACT

A glass composition comprising, based on mole %, 50–67% $B_2O_3$; 20–50% $M^{II}O$ where $M^{II}$ is selected from the group consisting of alkaline earth elements; 2–15% $Ln_2O_3$ where Ln is selected from the group consisting of rare earth elements and further comprising, based on mole %, 0–6% $M^I_2O$ where $M^I$ is selected from the group consisting of alkali elements and 0–10% $Al_2O$. The glass composition incorporated into a castable dielectric composition comprising a dispersion of finely divided solids comprising, based on solids: (a) 25–50 wt. % the glass composition; (b) 50–75 wt % refractory oxide; both dispersed in a solution of (c) an organic polymeric binder; and (d) a volatile organic solvent. The castable dielectric composition used in a method of forming a low loss green tape by casting a thin layer of the dispersion onto a flexible substrate and heating the cast layer to remove the volatile organic solvent.

8 Claims, No Drawings

BORATE GLASS BASED CERAMIC TAPE

This is a continuation of application Ser. No. 09/012,296, filed Jan. 23, 1998, now abandoned.

FIELD OF THE INVENTION

The invention is directed to a low loss ceramic tape for fabrication of multilayer circuits designed to operate at high frequency in the 1–25 GHz range and more particularly to a ceramic tape utilizing a borate glass.

BACKGROUND OF THE INVENTION

As the number and complexity of wireless applications grow, there are increasing needs for circuits designed to operate at high frequencies, i.e., in the 1–25 GHz range for audio, visual, and data transmissions. Circuit materials are needed which combine low dielectric and conductor losses in this frequency range. Low temperature cofired ceramic tape (LTCC) is a well known technology for combining high conducting, low loss metallization (silver and gold) with reliable ceramic dielectric layers for dense packaging of IC circuits. The majority of present LTCC systems are composed of a borosilicate glass with a ceramic filler and an alumina filler which imparts high strength. The borosilicate glasses usually contain lead and alumina which contribute to unacceptable loss in db/in. when operated in a GHz range. Consequently ceramic materials are needed which combine the effects of low loss, high conductivity and allow the use of alumina filler for reliable strength.

The present invention fills such a need by providing new glass chemistries which exhibit controlled crystallization with alumina filler to form ceramic exhibiting good strength, silver and gold compatibility, and low loss. In addition, the new glasses allow for low temperature firing, e.i., below the melting point of silver which broadens the processing latitude of present day systems.

SUMMARY OF THE INVENTION

The present invention relates to a glass composition comprising, based on mole %, 50–67% $B_2O_3$; 20–50% $M^{II}O$ where $M^{II}$ is selected from the group consisting of alkaline earth elements; 2–15% $Ln_2O_3$ where Ln is selected from the group consisting of rare earth elements and further comprising, based on mole %, 0–6% $M^I_2O$ where $M^I$ is selected from the group consisting of alkali elements and 0–10% $Al_2O_3$.

The invention is further directed to the glass composition incorporated into a castable dielectric composition comprising a dispersion of finely divided solids comprising, based on solids: (a) 25–50 wt. % the glass composition; (b) 50–75 wt % refractory oxide; both dispersed in a solution of (c) an organic polymeric binder; and (d) a volatile organic solvent.

The invention is still further directed to the castable dielectric composition used in a method of forming a low loss green tape by casting a thin layer of the dispersion onto a flexible substrate and heating the cast layer to remove the volatile organic solvent.

DETAILED DESCRIPTION OF THE INVENTION

Circuit materials which make up the ceramic tapes of this invention are free of elements, such as Pb and Cd, which are on the EPA hazardous waste list. This invention is based on the finding that ceramic tapes exhibiting low loss can be made by combining borate glasses with refractory oxides, e.g., alumina filler. In a preferred embodiment $Cu_2O$ is added to the castable dielectric composition to prevent staining with cofired silvers. Borate glasses are distinguished from the common borosilicate glasses containing $SiO_2$ as a framework component which have been found to exhibit higher loss when combined with alumina filler. The borate glasses used in the castable dielectric compositions of the present invention may contain several additives, e.g., alkaline earths such as CaO and MgO; and/or a $La_2O_3$ modifier which improves stability in water allowing water milling; and/or alkali oxides such as $Li_2O$.

The invention also extends to new borate glasses which may be used in other circuit material applications such as thick film pastes.

Glass

The ceramic tape of the present invention contains novel borate glasses which contribute to the low loss characteristic of the tape. The phrase "low loss" is referenced by S. Vasudavan and A. Shaikh, "Microwave Characterization of Low Temperature Cofired Tape Ceramic System," *Advancing Microelectronics* November/December 1995, p. 16. The article states, "Many telecommunication and avionics as well as commercial applications, require microelectronic packages with excellent high frequency performance. Generally, high frequency applications requires dielectric materials with low dielectric loss characteristics and high conductivity conductors. Electronic packages for microwave applications require low insertion loss for better signal transmission at high frequencies (in the range of 1 GHz to 30 GHz). This means that for a given signal power with a lower insertion loss package, the signal can travel for a long distance." On page 24, the work is summarized: ". . . it was demonstrated that silver metallization resulted in lower loss parameter. The insertion loss of Ferro A6 LTCC system is of the order 0.18 dB/in. at 10 GHz and 0.3 dB/in. at 20 GHz." The Ferro A6 tape is considered state of the art low loss. Thus, low loss is needed for high frequency circuits to enable the transmission of a signal. From the above it is recognized that low is relative. If the loss is to high, the signal will be completely lost and no transmission will take place.

This high frequency loss mechanism is not well understood but materials that exhibit low loss are generally composed of small ions tightly bound in the structure; e.g., quartz $SiO_2$ and corundum $Al_2O_3$. Large ions having a low ionic charge/radius ratio such as Pb+2 contribute to high loss. However, even Ca borosilicate glasses when filled with alumina show high loss.

The borate glasses of this invention are novel and differ from borosilicate glasses in that ceramics formed by the present invention with alumina filler have low loss in the GHz frequencies. The components of the glass are generally, based on mole %, 20–50 $M^{II}O$ where $M^{II}$ an alkaline earth ion, 50–67 $B_2O_3$, 2–15 $Ln_2O_3$ where Ln is a rare earth ion or mixtures thereof with the preferred formulations being, 25–50 $M^{II}O$, 55–60 $B_2O_3$, 4–15 $Ln_2O_3$ and the most preferred, 25–30 $M^{II}O$, 55–60$B_2O_3$, 10–15 $Ln_2O_3$. The glass may further contain 0–6 $M^I_2O$ where $M^I$ is an alkali ion, with 0–3 being preferred and 2–3 most preferred and 0–10 $Al_2O_3$ with 0–6 being preferred and 0 most preferred. Again, the mechanism of loss is not well understood, but is believed that the Al+3 ion from the $Al_2O_3$ filler substitutes for Si+4 in the glass framework in a borosilicate glass, but the Al+3 may not substitute for the framework B+3 in a borate glass because of the ionic size difference. In the framework, Al+3 is tetrahedrally coordinated and is less tightly bound than when octahedrally coordinated as in the $Al_2O_3$ corundum structure. The tetrahedral tightly bound $Al_2O_3$ would be capable of increasing loss by absorbing and dissipating the microwave energy. Examples 21, 30 and 32 that follow where the glass contains $SiO_2$ show that the tape with alumina filler exhibits higher loss. This is also true if the $SiO_2$ is added as a filler.

Therefore, small tightly bound $B^{+3}$ was used as the primary framework component of the glass. It appears that the crystallization of the glass and reactive properties of the crystallizing glass with the filler may contribute to the low loss mechanism by tightly binding the ions. In other words, the glasses were designed to crystallize by partial reaction with the alumina filler, i. e., glasses containing CaO and $B_2O_3$ with alumina filler, form crystals of $CaAl_2B_2O_7$ when fired at 875° C. It should be noted that other alkaline earth ions may be partially substituted for Ca. Rare earth oxides or mixed rare earth oxides with the general formula of $Ln_2O_3$ (Ln is used to designate mixed rare earths) may be included in the glass. For example, when a rare earth oxide such as $La_2O_3$ is present in the glass, crystals of $LaBO_3$ are formed which lowers the loss. In addition to the crystal formation, low melting temperatures were maintained to permit silver compatibility. In the best mode composition, both crystals are formed. For example, the ceramic formed in Example 1 was studied to identify the formed phases. X ray diffraction showed the presence of unreacted $Al_2O_3$ filler, crystalline $CaAl_2B_2O_7$ formed by partial reaction of the $Al_2O_3$ with the glass, and crystalline $LaBO_3$ formed by crystallization of the remaining glass. The phases form by reaction:

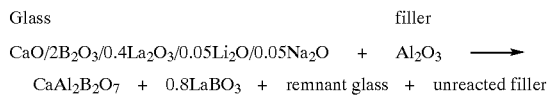

| Glass | | filler | |
|---|---|---|---|
| $CaO/2B_2O_3/0.4La_2O_3/0.05Li_2O/0.05Na_2O$ | + | $Al_2O_3$ | → |
| $CaAl_2B_2O_7$ + $0.8LaBO_3$ + remnant glass | + | unreacted filler | |

The remnant glass would contain $0.6B_2O_3/0.05Li_2O/0.05Na_2O$ and perhaps some dissolved $Al_2O_3$.

The glass was formulated with sufficient durability in water for tape stability and low cost water millability. The glasses used in present ceramic tapes are milled between 1–5μ average particle size. The lowest cost and easiest method is to ball mill in water. Glasses of $CaO/B_2O_3$ are not highly stable in water. This is best seen in a psd measurement where the glass powder is dispersed in water. If the glass is unstable, the d10 which is the size of the smallest 10% will be high (about 5μ) indicating that the fine particles have dissolved. It was found that addition of $Ln_2O_3$ or preferably $La_2O_3$ to the glass allows milling in water. With this addition the d10 can be milled to 0.69μ. Therfore, it is known in the art that high borate frits are sensitive to water. It was found that by virtue of the chemistry of the glass of the present invention eventhough there is a high boran level in the glass, the glass is less sensitive to water. This lack of sensitivity greatly increases its ease of processing.

A glass described herein is also compatible with cofired silver conductors. The glass must not flow too much on firing or it will mix with the silver and will not allow solder wetting. Solder wetting is an important feature to allow connection of the ceramic circuit to external wiring such as on a printed circuit board. In a preferred mode it was found that the addition of alkali ions, e.g., $Na^{+1}$ or $Li^{+1}$ to the glass increase the degree of solder wetting and properties of loss and water millability are not compromised.

For further silver compatibility, the cofired silver must not stain the ceramic. Commonly glasses high in $B_2O_3$ will show a halo stain around cofired silver conductors due to migration of $Ag^{+1}$ through the borate structure. It was found that use of $Cu_2O$ additive to formulations of tape compositions prevents the stain and imparts a pleasing blue color to the ceramic on oxidation to $Cu^{+2}$ on firing. The mechanism of the stain prevention is thought to be due to the action of $Cu^{+1}$ blocking potential $Ag^{+1}$ sites. The $Cu_2O$ may be added to the tape formulation up to and including 5% by weight based on solids without harming other properties.

In the formulation of tape compositions, the amount of glass relative to the amount of refractory material is quite important. If the glass concentration exceeds 75% by wt., based on glass and filler, the resultant fired layer tends to have an irregular surface, the multilayer structure tends to become too brittle, solderability of the surface is degraded and the properties of the associated conductive layers also tend to be degraded. On the other hand, if the amount of glass is less than 25% by wt., the fired structure is not sufficiently densified and is too porous. In addition, the fired structure may lose planarity (flatness). In consideration of these variables, it is preferred that the composition contain 25–50% wt. glass and preferably still 43–50% wt. glass. Within these limits for the concentration of glass and the complemental amount of filler in the composition and the solubility of the refractory in the glass, it will be apparent that, during firing, the liquid glass will become saturated with filler material.

$Al_2O_3$ Filler $Al_2O_3$ is the chosen refractory filler since it may partially react with the glass to form $CaAl_2B_2O_7$ and the remaining $Al_2O_3$ has only minimal solubility in the remaining glass. Other fillers, quartz, $CaZrO_3$, forslerit, mullite, cordierite, forsterite, zircon, zirconia, $ZrO_2$, $TiO_2$, $CaTiO_3$, $MgTiO_3$, $SiO_2$, amorphous silica, or millite may be used by themselves or in mixtures to adjust the temperature coefficient of expansion (TCE). The refractory oxide filler is added to the castable dielectric composition in an amount of 50–75 wt % based on solids.

Another function of the refractory is Theological control of the entire system during firing. The refractory particles limit flow of the glass by acting as a physical barrier. They also inhibit sintering of the glass and thus facilitate better burnout of the organics.

For the purpose of obtaining higher densification of the composition upon firing, it is important that the inorganic solids have quite small particle sizes. In particular, substantially none of the particles should exceed 15 μm and preferably they should not exceed 10 μm. Subject to these maximum size limitations, it is preferred that the 50% point of the particles, both glass and refractory, be no less than 1 μm and preferably the 50% point should lie in the 2–5 μm range.

Polymeric Binder

The organic medium in which the glass and refractory inorganic solids are dispersed is comprised of the polymeric binder which is dissolved in a volatile organic solvent and, optionally, other dissolved materials such as plasticizers, release agents, dispersing agents, stripping agents, antifouling agents and wetting agents.

To obtain better binding efficiency, it is preferred to use at least 5% wt. polymer binder for 90% vol. ceramic solids. However, it is further preferred to use no more than 20% wt. polymer binder in 80% wt. ceramic solids. Within these limits, it is desirable to use the least possible amount of binder vis-à-vis solids in order to reduce the amount of organics which must be removed by pyrolysis and to obtain better particle packing which gives reduced shrinkage upon firing.

In the past, various polymeric materials have been employed as the binder for green tapes, e.g., poly(vinyl butyral), poly(vinyl acetate), poly(vinyl alcohol), cellulosic polymers such as methyl cellulose, ethyl cellulose, hydroxyethyl cellulose, methylhydroxyethyl cellulose, atactic polypropylene, polyethylene, silicon polymers such as poly(methyl siloxane), poly(methylphenyl siloxane), polystyrene, butadiene/styrene copolymer, polystyrene, poly(vinyl pyrollidone), polyamides, high molecular weight polyethers, copolymers of ethylene oxide and propylene oxide, polyacrylamides, and various acrylic polymers such as sodium polyacrylate, poly(lower alkyl acrylates), poly(lower alkyl methacrylates) and various copolymers and multipolymers of lower alkyl acrylates and methacrylates. Copolymers of ethyl methacrylate and methyl acrylate and terpolymers of ethyl acrylate, methyl methacrylate and methacyrlic acid have been previously used as binders for slip casting materials.

U.S. Pat. No. 4,536,535 to Usala issued Aug. 20, 1985 has disclosed an organic binder which is a mixture of compatible multipolymers of 0–100% wt. $C_{1-8}$ alkyl methacrylate, 100–0% wt. $C_{1-8}$ alkyl acrylate and 0–5% wt. ethylenically unsaturated carboxylic acid of amine. Because the polymers permit the use of minimum amounts of binder and maximum amounts of dielectric solids, their use is preferred with the dielectric composition of this invention. For this reason, the disclosure of the above referred Usala application is incorporated by reference herein.

Frequently, the polymeric binder will also contain a small amount, relative to the binder polymer, of a plasticizer which serves to lower the glass transition temperature (Tg) of the binder polymer. The choice of plasticizers is, of course, determined primarily by the polymer which must be modified. Among the plasticizers which have been used in various binder systems are diethyl phthalate, dibutyl phthalate, dioctyl phthalate, butyl benzyl phthalate, alkyl phosphates, polyalkylene glycols, glycerol, poly(ethylene oxides), hydroxyethylated alkyl phenol, dialkyldithiophosphonate and poly(isobutylene). Of these, butyl benzyl phthalate is most frequently used in acrylic polymer systems because it can be used effectively in relatively small concentrations.

Organic Solvent

The solvent component of the casting solution is chosen so as to obtain complete solution of the polymer and sufficiently high volatility to enable the solvent to be evaporated from the dispersion by the application of relatively low levels of heat at atmospheric pressure. In addition, the solvent must boil well below the boiling point and decomposition temperature of any other additives contained in the organic medium. Thus, solvents having atmospheric boiling points below 150° C. are used most frequently. Such solvents include acetone, xylene, methanol, ethanol, isopropanol, methyl ethyl ketone, ethyl acetate, 1,1,1-trichloroethane, tetrachloroethylene, amyl acetate, 2,2,4-triethyl pentanediol-1,3-monoisobutyrate, toluene, methylene chloride and fluorocarbons. It will be recognized that individual components of the solvent may not be complete solvents for the binder polymer. Yet, when blended with other solvent components, they function as solvents.

A particularly preferred solvent is ethyl acetate since it avoids the use of environmentally hazardous chlorocarbons.

In addition to the solvent and polymer, a plasticizer is used to impart workability in cutting laminating. A preferred plasticizer is BENZOFLEX® 400 which is a polypropylene glycol dibenzoate.

Application

A green tape is formed by casting a thin layer of a dispersion of the glass, filler, polymeric binder and solvent as described above onto a flexible substrate, heating the cast layer to remove the volatile solvent and then separating the solvent-free layer from the substrate. The green tape is used primarily as a dielectric or insulating material for multilayer electronic circuits. A roll of green tape is blanked with registration holes in each corner to a size somewhat larger than the actual dimensions of the circuit. To connect various layers of the multilayer circuit, via holes are formed in the green tape. This is typically done by mechanical punching. However, a sharply focused laser can be used to volatilize the green tape. Typical via hole sizes range from 0.006" to 0.25". The interconnections between layers are formed by filling the via holes with a thick film conductive ink. This ink is usually applied by standard screen printing techniques. Each layer of circuitry is completed by screen printing conductor tracks. Also, resistor inks or high dielectric capacitor inks can be printed on each layer to form resistive or capacitive circuit elements. Also, especially formulated high dielectric constant green tapes similar to those used in the multilayer capacitor industry can be incorporated as part of the multilayer circuitry.

After each layer of the circuit is completed, the individual layers are stacked and laminated. A confined pressing die is used to insure precise alignment between layers. The laminates are trimmed with a hot stage cutter. Firing is carried out in a standard thick film conveyor belt furnace or in a box furnace with a programmed heating cycle.

As used herein, the term "firing" means heating the assemblage in an oxidizing atmosphere such as air to a temperature and for a time sufficient to volatilize (burn-out) all of the organic material in the layers of the assemblage to sinter any glass, metal or dielectric material in the layers and thus densify the dielectric layer.

It will be recognized by those skilled in the art that in each of the laminating steps the layers must be accurate in registration so that the vias are properly connected to the appropriate contact points of the adjacent functional layer.

The term "functional layer" refers to the layers printed on the ceramic green tape which have either conductive, resistive or capacitive functionality. Thus, as indicated above, a typical green tape layer may have printed thereon one or more resistor circuits and/or capacitors as well as a conductive circuit.

The present invention will be described in further detail by giving practical examples. The scope of the present invention, however, is not limited in any way by these practical examples.

EXAMPLES

Ring Resonator

Throughout the examples ring resonators were fabricated using tapes of the present invention. The ring resonator does not suffer from open-ended effects as a linear resonator. Silver metallizations were used to make conductor traces. Blank sheets of the present invention of 3"×3" in size were cut and laminated to form two four layer stacked structures. The conductor trace and ground plane were printed on separate structures and then the conductor trace and ground plane were laminated together to form a ring resonator structure. The structure was fired to form a dense structure. The conductor trace also formed a dense structure. The edges of the ring resonator were trimmed to a size equal to 2.25"×2.25" to fit a fixture for microwave measurement.

Example 1

Glass was prepared of composition in mole %: $B_2O_3$ 55.56; CaO 27.78 $La_2O_3$ 13.89; $Li_2O$ 1.39 and $Na_2O$ 1.39 by mixing ingredients and firing in a platinum crucible at 1300° C. The melt was mixed and fritted into water. It was milled in water and hot air dried. PSD was d10=0.91, d50=4.26 and d90=10.42. Tape was prepared using various ratios of glass/alumina filler until the point of full densification was achieved (as shown by the proceeding composition) yet without excessive glass to impede solder wetting of cofired silvers and paladium silver thick film metallization. At this particle size, tape was prepared by dispersing powders: 45 g glass, 54.8 g of $Al_2O_3$ and 0.2 g of $Cu_2O$ in an ethylacetate solvent with methylmethacrylate, methacrylic acid copolymer binder and plasticizer. The slip was cast on a Mylar sheet and dried to form a tape. The tape was cut, laminated, printed with thick film silver and fired in a conventional profile with an 875° C./20 min peak. The ceramic fired dense with about 10% shrinkage and showed no stain with cofired silvers. The cofired silvers and paladium silver showed good wetting of conventional solder. To measure loss at high frequency, a ring resonator was prepared from the tape by cofiring a silver ring and ground planes. Measurements were made using a Hewlett Packard 8510C Microwave Network Analyzer. The resulting losses in db/in.

| GHz | db/in. |
|---|---|
| 1 | 0.03 |
| 5 | 0.08 |
| 10 | 0.12 |
| 15 | 0.15 |
| 20 | 0.22 |

TABLE 1

Glass composition in mole %

| Ex. # | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|
| CaO | 28.6 | 25 | 26.7 | 30.8 | 25 | 27.3 | 28.57 | 28.57 | 28.57 | 28.57 | 30 | 27.78 | 33.3 | 42.5 | 28.57 |
| MgO | 14.3 | 25 | 13.3 | — | 12.5 | 13.6 | | | | | | | | | |
| $B_2O_3$ | 57.1 | 50 | 53.3 | 61.5 | 50 | 54.5 | 57.14 | 57.14 | 57.14 | 57.14 | 60 | 55.56 | 66.7 | 28 | 57.14 |
| $Li_2O$ | — | — | 6.7 | — | — | — | 1.43 | — | 2.86 | — | — | 1.39 | | | 1.43 |
| $La_2O_3$ | — | — | — | 7.7 | — | 4.5 | 11.43 | 14.29 | 11.43 | 11.43 | 10 | 13.89 | | | 11.43 |
| $SiO_2$ | — | — | | — | 12.5 | — | — | | | | | | | 29.5 | |
| $Na_2O$ | | | | | | | 1.43 | — | — | 2.86 | — | 1.39 | | | 1.43 |
| Water millable | No | No | No | Yes | No | Yes | Yes | Yes | Yes | Yes | Yes | Yes | No | No | Yes |

TABLE 2

Ceramic tape composition in wt. % based on solids

| Ex. # | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|
| Glass Ex. # | 2 | 3 | 4 | 5 | 6 | 7 | 8 | 9 | 10 | 11 | 12 | 13 | 14 | 15 | 16 |
| Glass | 27 | 40 | 30 | 40 | 30 | 35 | 45 | 49 | 45 | 48 | 48 | 45 | 30 | 30 | 45 |
| $Al_2O_3$ | 72.8 | 59.8 | 69.8 | 59.8 | 69.8 | 64.8 | 54.8 | 50.8 | 54.8 | 51.8 | 51.8 | 54.8 | 70 | 70 | 48.75 |
| $Cu_2O$ | 0.2 | 0.2 | 0.2 | 0.2 | 0.2 | 0.2 | 0.2 | 0.2 | 0.2 | 0.2 | 0.2 | 0.2 | — | — | 0.2 |
| $TiO_2$ | — | — | — | — | — | — | — | — | — | — | — | — | — | — | 6.5 |
| Solder Wetting | — | — | — | — | — | — | — | No | Yes | Yes | No | Yes | — | — | No |
| Losses dB/in. of tape composition GHz | | | | | | | | | | | | | | | |
| 1 | 0.03 | 0.03 | 0.03 | 0.04 | 0.03 | 0.03 | 0.03 | * | 0.03 | 0.03 | * | — | — | — | — |
| 5 | 0.09 | 0.09 | 0.08 | 0.10 | 0.12 | 0.11 | 0.09 | — | 0.08 | 0.09 | — | — | 0.11 | 0.19 | — |
| 10 | 0.15 | 0.14 | 0.12 | 0.15 | 0.22 | 0.19 | 0.12 | — | 0.13 | 0.13 | — | — | 0.16 | 0.33 | — |
| 15 | 0.23 | 0.23 | 0.20 | -.21 | high | 0.29 | 0.15 | — | 0.16 | 0.18 | — | — | 0.27 | 0.78 | — |
| 20 | — | — | 0.26 | — | — | — | 0.22 | — | 0.24 | 0.20 | — | — | 0.29 | over measurable amounts | — |

* Ring resonator bowed and could not be measured

Examples 2–16

Examples 2–16 with the exception of Examples 6 & 15 denote glass compositions of the present invention. Glasses are prepared according to conventional glass making techniques.

Examples 17–31

In Examples 17–31 the ceramic green tape was prepared by mixing the glass found in Table 1 with polymer, plasticizer, and solvent as described in Example 1 and fillers as found in Table 2. Therefore, Table 2 discloses tape composition utilizing the glasses of Table 1. Ceramic parts were formed by firing laminated and printed parts in a programmed heating cycle in a box furnace: 875° C. peaking temperature to form the ceramic. Ring resonators were then prepared for loss measurements, i.e., a thick film silver ring and ground plane. $Cu_2O$ was added to prevent staining with cofired silver. Solderability of cofired silver and Pd/Ag thick film parts are given for Examples 24–28 and 31.

Table 2 also shows the higher loss (db/in.) for the glass containing $SiO_2$. Examples 29 and 30 show the the contrast between the Ca borate glass and a typical Ca borosilicate glass. The loss for the alumina filled ceramic formed with the borate form is much lower than that of the borosilicate glass. The Table also shows use of MgO; the good effect of $La_2O_3$ on water millability and the good effect of $Na_2O$ and $Li_2O$ on solder wetting.

Example 32

This Example shows the bad effect of $SiO_2$ filler addition to the tape composition. Tapes were prepared:

| | |
|---|---|
| Glass (Example 8) | 45 |
| $Al_2O_3$ filler | 52.8 |
| $Cu_2O$ | 0.2 |
| $SiO_2$ filler | 1.0 |
| solder wetting | No |
| Losses: | |
| GHz | |
| 1 | 0.03 |
| 5 | 0.09 |
| 10 | 0.18 |
| 15 | 0.40 |
| 20 | Too high |

Examples 33–34

The following Example shows the effect of $Cu_2O$ on preventing cofired silver stain:

Glass (section 4 of the original write-up) shows a yellow halo stain around cofired silver and paladium silver metallization. Tape was prepared:

| | Ex. 33 | Ex. 34 |
|---|---|---|
| Tape Composition | wt % | wt % |
| Glass (Example 14) | 28.8 | 30 |
| $Al_2O_3$ filler | 67.3 | 70 |
| $Cu_2O$ | 3.8 | — |

Parts were screen printed with conductor lines of thick film silver and paladium silver. Firing was carried out in a conventional box furnace with a peak of 875° C. The ceramic parts (Ex. 34) without $Cu_2O$ showed a severe stain around the metal while the parts (Ex. 33) with the $Cu_2O$ showed no stain and the ceramic became a blue color. It was found that levels as low as 0.1% $Cu_2O$ were effective in preventing stain.

Example 35

This example illustrates the use of mixed rare earths in the invention. The $Ln_2O_3$ contains: 62.5% $La_2O_3$, 0.3% $CeO_2$, 8.6% $Pr_6O_{11}$, 21.1% $Nd_2O_3$, 1.5% other rare earths. The $Ln_2O_3$ was obtained and tested in the Ex. 1 glass composition by substituting $Ln_2O_3$ for $La_2O_3$. The tape fired to a green yellow color. Solder wetting was poor. Losses were a little higher but still relatively low.

Examples 36–38

Glasses were prepared with $Al_2O_3$ and tape prepared. The results show that $Al_2O_3$ increases distortion by increasing crystallization and solder wetting is poorer. Losses are ok.

| Example | 36 | 37 | 38 |
|---|---|---|---|
| Glass | mole % | mole % | mole % |
| CaO | 30 | 28.6 | 27 |
| $B_2O_3$ | 60 | 57.1 | 54 |
| $La_2O_3$ | — | 5.7 | 10.8 |
| $Na_2O$ | — | 2.8 | 2.7 |
| $Al_2O_3$ | 10 | 5.7 | 5.4 |
| | wt. % | wt. % | wt. % |
| Tape composition: | | | |
| Glass | 35 | 41 | 48 |
| $Al_2O_3$ | 65 | 58.8 | 51.8 |
| $Cu_2O$ | — | 0.2 | 0.2 |
| Results | | | |
| Shrinkage | 11.1 | 11.5 | 10.8 |
| cofired Ag | bowed | bowed | bowed |
| solder wet | none | none | 80% |
| Losses: | | | |
| GHz | | | |
| 1 | — | 0.04 | 0.03 |
| 5 | — | 0.10 | 0.09 |
| 10 | — | 0.15 | 0.12 |
| 15 | — | 0.23 | 0.18 |
| 20 | — | 0.54 | 0.22 |

Example 39

Glasses were prepared with the formulations given below and then tape was prepared.

Tape was prepared of wt. %, based on solids.

| | |
|---|---|
| Glass composition of Example 8 | 44.8 |
| $Al_2O_3$ filler | 48.5 |
| $TiO_2$ filler | 6.5 |
| $Cu_2O$ | 0.2 |

Parts were prepared and fired as described in Example 1.

| | |
|---|---|
| Cofired silver | flat |
| solder wet | poor |

Losses were good as shown below:

| Ghz | db/in |
|-----|-------|
| 1   | 0.03  |
| 5   | 0.08  |
| 10  | 0.17  |
| 15  | 0.17  |
| 20  | 0.32  |

What is claimed is:

1. A glass composition consisting essentially of, based on mole %, 50–67% $B_2O_3$; 20–50% CaO; 2–15% $Ln_2O_3$ where Ln is selected from the group consisting of rare earth elements and mixtures thereof; 0–6% $M'_2O$ where $M'$ is selected from the group consisting of alkali elements; and 0–10% $Al_2O_3$, with the proviso that the composition is water millable.

2. The composition of claim 1 wherein $Ln_2O_3$ is $La_2O_3$.

3. The composition of claim 1 wherein $M'_2O$ is selected from the group consisting of $Li_2O$, $Na_2O$ and mixtures thereof.

4. A composition comprising, based on solids:
   (a) 25–50 wt. % glass composition as in any of claims 1, 2 or 3;
   (b) 50–75 wt. % refractory oxide; both dispersed in a solution of
   (c) an organic polymeric binder.

5. The composition of claim 4 further comprising a volatile organic solvent.

6. The composition of claim 4 further comprising 0–5 wt. % $Cu_2O$.

7. The composition of claim 4 wherein the refractory oxide is $Al_2O_3$.

8. The composition of claim 1 wherein the CaO is partially substituted by BaO, MgO or mixtures thereof.

* * * * *